US012610617B2

(12) United States Patent
Li et al.

(10) Patent No.: US 12,610,617 B2
(45) Date of Patent: Apr. 21, 2026

(54) DISPLAY PANEL AND DISPLAY APPARATUS

(71) Applicant: Xiamen Tianma Display Technology Co., Ltd., Xiamen (CN)

(72) Inventors: Landi Li, Xiamen (CN); Huangyao Wu, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 543 days.

(21) Appl. No.: 18/118,156

(22) Filed: Mar. 7, 2023

(65) Prior Publication Data

US 2024/0222383 A1 Jul. 4, 2024

(30) Foreign Application Priority Data

Dec. 30, 2022 (CN) .......................... 202211730846.1

(51) Int. Cl.
*H10D 86/40* (2025.01)

(52) U.S. Cl.
CPC ......... *H10D 86/441* (2025.01); *H10D 86/481* (2025.01)

(58) Field of Classification Search
CPC ................ H10D 86/441; H10D 86/481; G02F 1/136286
See application file for complete search history.

(56) References Cited

U.S. PATENT DOCUMENTS

| 2008/0003723 | A1 | | 1/2008 | Yang et al. | |
|---|---|---|---|---|---|
| 2021/0036022 | A1 | * | 2/2021 | Han | ....................... H10D 86/441 |
| 2022/0157860 | A1 | * | 5/2022 | Zhu | ....................... H10D 86/443 |

FOREIGN PATENT DOCUMENTS

| CN | 108803160 A | * | 11/2018 | ....... G02F 1/136286 |
|---|---|---|---|---|
| CN | 111081141 A | | 4/2020 | |
| CN | 114361223 A | * | 4/2022 | ........... H10D 86/441 |
| KR | 20180058910 A | | 6/2018 | |
| WO | 2014046099 A1 | | 3/2014 | |

OTHER PUBLICATIONS

The First Office Action dated Apr. 9, 2025 for Chinese Application No. 202211730846.1, 12 pages.

* cited by examiner

*Primary Examiner* — Peter M Albrecht
(74) *Attorney, Agent, or Firm* — East IP P.C.

(57) ABSTRACT

The present application discloses a display panel and a display apparatus. The display panel includes a hole area, a surrounding routing area, and a regular routing area. The display panel includes a substrate, a first wiring, a second wiring, and a first wiring layer, a shield layer, and a second wiring layer. The first wiring includes a first straight segment positioned at the regular routing area and a first curved segment positioned at the surrounding routing area. The second wiring includes a second straight segment positioned at the regular routing area and a second curved segment positioned at the surrounding routing area. An orthographic projection of a shield layer on the substrate overlaps an orthographic projection of the first curved segment on the substrate, and/or the orthographic projection of the shield layer on the substrate overlaps an orthographic projection of the second curved segment on the substrate.

16 Claims, 14 Drawing Sheets

1

DISPLAY PANEL AND DISPLAY APPARATUS

CROSS-REFERENCE TO RELATED APPLICATION

This application claims priority to Chinese Patent Application No. 202211730846.1, filed on Dec. 30, 2022, which is hereby incorporated by reference in its entirety.

TECHNICAL FIELD

The present application relates to the technical field of displays, and particularly relates to a display panel and a display apparatus.

BACKGROUND

With the development of display technology, the performance requirements of display devices become higher and higher. In the technology of hole-punch screen, the display area is hole-punched to form a hole area, and photosensitive modules are integrated under the hole area, so as to achieve good operation of the photosensitive modules. However, the hole area is formed so that a part of wirings need to bypass the hole area to form winding wires with narrow spacings therebetween, so that signal interference tends to occur between adjacent ones of the winding wires, thereby seriously affecting the display effect.

SUMMARY

Embodiments of the present application provide a display panel and a display apparatus.

An embodiment of a first aspect of the present embodiments provides a display panel. The display panel includes a hole area, a surrounding routing area surrounding at least a part of the hole area, and a regular routing area surrounding at least a part of the surrounding routing area. The display panel includes: a substrate; a first wiring layer formed on a side of the substrate; a shield layer formed on a side of the first wiring layer facing away from the substrate; a second wiring layer formed on a side of the shield layer facing away from the first wiring layer; a first wiring including a first straight segment positioned at the regular routing area and a first curved segment positioned at the surrounding routing area, the first curved segment being positioned in the first wiring layer; a second wiring including a second straight segment positioned at the regular routing area and a second curved segment positioned at the surrounding routing area, the second straight segment extending along same direction as the first straight segment, and the second curved segment being positioned in the second wiring layer; wherein an orthographic projection of the shield layer on the substrate overlaps an orthographic projection of the first curved segment on the substrate, and/or the orthographic projection of the shield layer on the substrate overlaps an orthographic projection of the second curved segment on the substrate.

An embodiment of a second aspect of the present embodiments further provides a display apparatus including a display panel, the display panel including a hole area, a surrounding routing area surrounding at least a part of the hole area, and a regular routing area surrounding at least a part of the surrounding routing area, wherein the display panel includes: a substrate; a first wiring layer formed on a side of the substrate; a shield layer formed on a side of the first wiring layer facing away from the substrate; a second wiring layer formed on a side of the shield layer facing away from the first wiring layer; a first wiring including a first straight segment positioned at the regular routing area and a first curved segment positioned at the surrounding routing area, the first curved segment being positioned in the first wiring layer; a second wiring including a second straight segment positioned at the regular routing area and a second curved segment positioned at the surrounding routing area, the second straight segment extending along a same direction as the first straight segment, and the second curved segment being positioned in the second wiring layer; wherein an orthographic projection of the shield layer on the substrate overlaps an orthographic projection of the first curved segment on the substrate, and/or the orthographic projection of the shield layer on the substrate overlaps an orthographic projection of the second curved segment on the substrate.

BRIEF DESCRIPTION OF THE DRAWINGS

In order to illustrate technical solutions of embodiments of the present application more clearly, the drawings needed for the embodiments of the present application will be briefly described. Obviously, the drawings described below are merely some embodiments of the present application. For a person skilled in the art, other drawings can also be obtained from these drawings without any inventive effort.

In the drawings.

1—Display Panel; A1—Hole Area; A2—Surrounding Routing Area; A3—Regular Routing Area; 10—Substrate; 101—Inorganic Material Barrier Layer; 102—Flexible Organic Material Layer; 11—First Wiring Layer; 111—First Wiring; 1111—First Straight Segment; 1112—First Curved Segment; 12—Shield Layer; 121—First Shield Unit; 122—Second Shield Unit; 13—Second Wiring Layer; 131—Second Wiring; 1311—Second Straight Segment; 1312—Second Curved Segment; 14—Insulation Layer; 15—Planarization Layer; 16—First Spacing; 17—Second Spacing; 18—Semiconductor Layer; 19—First Insulation Layer; 20—Gate Metal Layer; 21—Second Insulation Layer; 22—Capacitor Metal Layer; 23—Third Insulation Layer; 24—Source/Drain Metal Layer; 25—Fourth Insulation Layer; 26—Auxiliary Metal Layer; 27—Third Wiring; 271—Straight Wire Portion; 272—Winding Wire Portion.

DETAILED DESCRIPTION

Features and exemplary embodiments of various aspects of the present application will be described in detail below. In the following detailed description, numerous specific details are set forth in order to provide a thorough understanding of the present application. However, it will be apparent to a person skilled in the art that the present application may be practiced without some of these specific details. The following description of the embodiments is merely to provide a better understanding of the present application by illustrating examples of the present application.

It should be noted that, in this document, relational terms such as "first" and "second" are used merely to distinguish one entity or operation from another entity or operation, and do not necessarily require or imply such actual relationship or sequence between these entities or operations. Moreover, the terms "comprising", "including" or any other variation thereof are intended to encompass a non-exclusive inclusion such that a process, method, article or device that includes a list of elements includes not only those elements, but also includes other elements that are not explicitly listed but inherent to such a process, method, article or device. Without further limitation, an element defined by the term "comprising . . . " does not preclude presence of additional elements in a process, method, article or device that includes the element.

Figure 1:
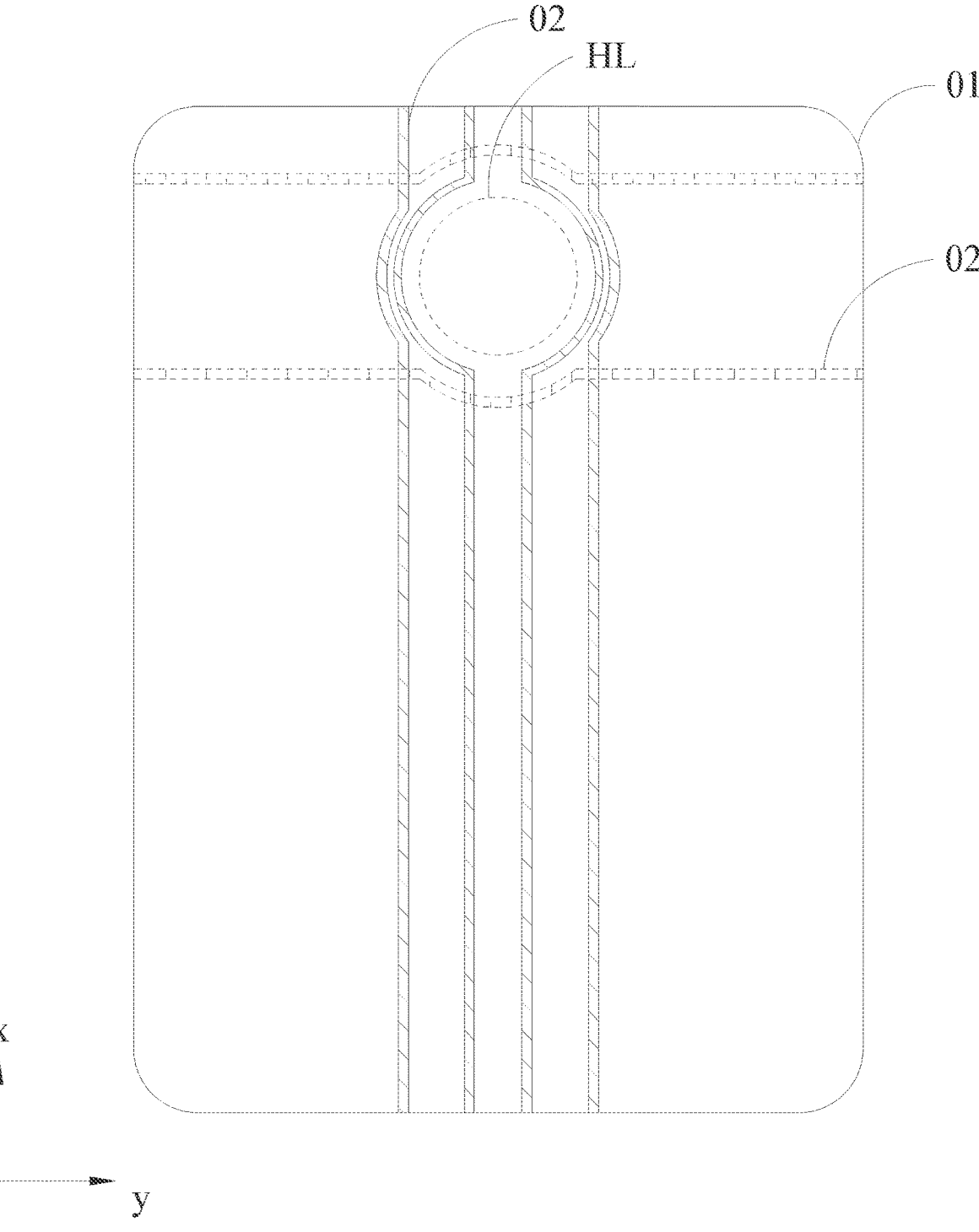
FIG. 1 is a top view of a display panel provided by the prior art.

The inventors have found through research that, as shown in FIG. 1, in a hole-punched screen, a hole area HL of the display panel 01 is integrated with a photosensitive module. The photosensitive module needs a desired light transmission environment to achieve high-quality work. Therefore, the hole area HL needs to have a high light transmittance so as to ensure desired working performance of the photosensitive module. In the display panel 01, wirings 02 extend along a first direction x or a second direction y. As going by the hole area HL, the wirings 02 needs to bypass the hole area HL to form winding wires, so as to avoid the wirings 02 directly passing through the hole area HL and affecting the light transmittance of the hole area HL. Since the hole area HL occupies a certain space, spacings between the wirings 02 after bypassing the hole area HL become narrow, so that signal interference tends to occur between adjacent winding wires, thereby seriously affecting the display effect. Based on a study of the above problem, the inventors have provided a display panel and a display apparatus to reduce signal interference between wirings in the vicinity of the hole area of the display panel, thereby improving the display quality of the display panel.

Figure 2:
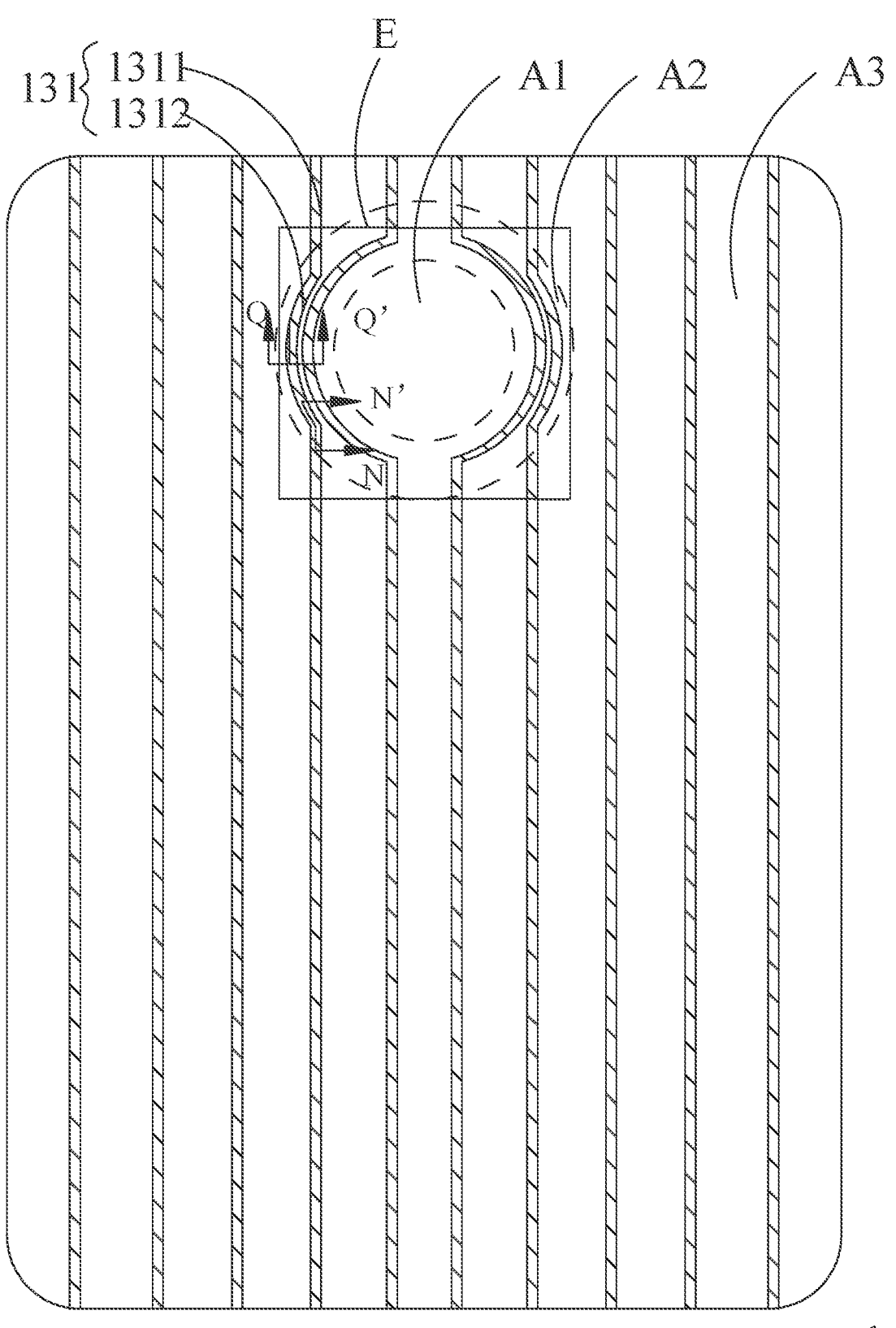
FIG. 2 is a top view of a display panel provided by an embodiment of the present application.
Figure 3:
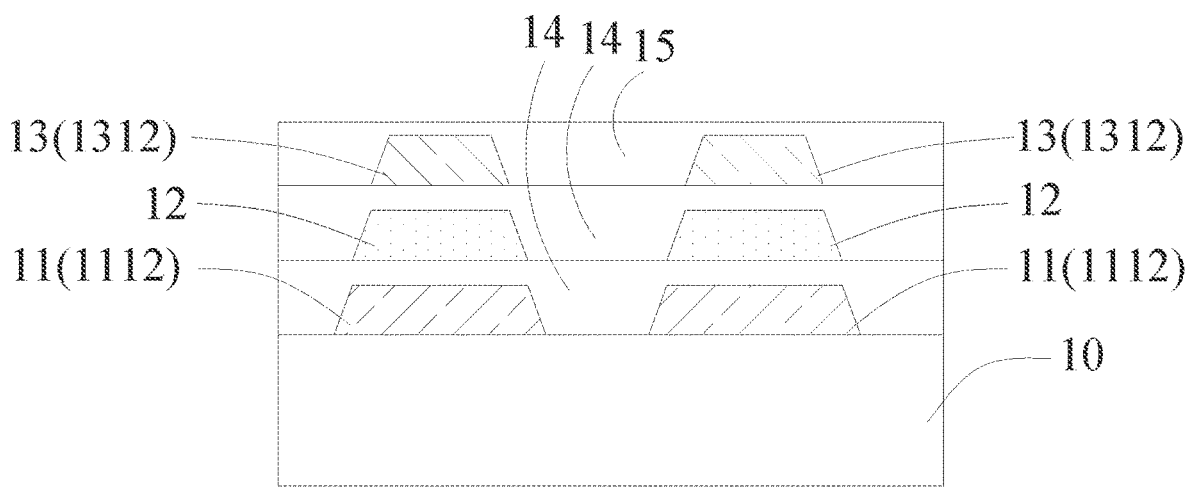
FIG. 3 is a sectional view taken along Q-Q' in FIG. 2.
Figure 4:
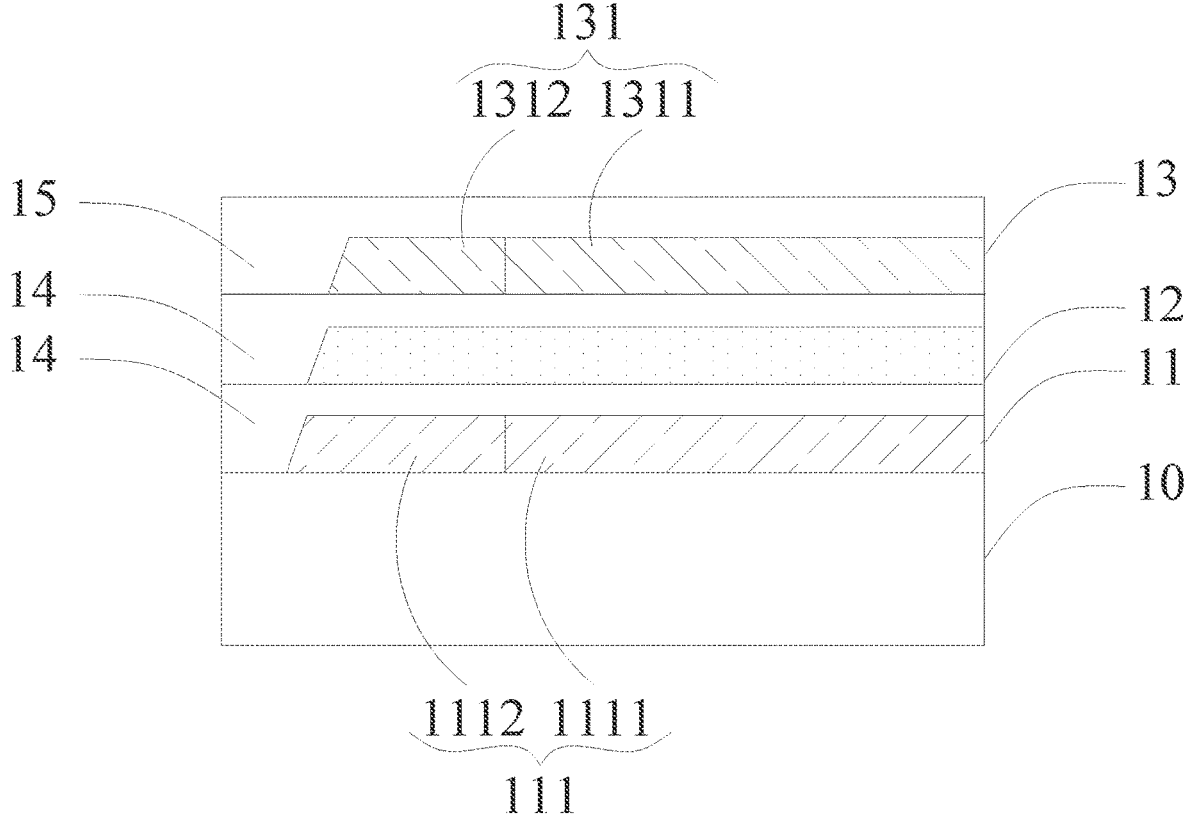
FIG. 4 is a sectional view taken along N-N' in FIG. 2.

For a better understanding of the present application, a detailed description of a display panel and a display apparatus of embodiments of the present application will be described in detail below with reference to FIG. 2 to FIG. 19. Reference is made to FIG. 2 to FIG. 4. FIG. 2 is a top view of a display panel provided by an embodiment of the present application. FIG. 3 is a sectional view taken along Q-Q' in FIG. 2. FIG. 4 is a sectional view taken along N-N' in FIG. 2.

Embodiments of the present application provide a display panel 1. The display panel 1 includes a hole area A1, a surrounding routing area A2, and a regular routing area A3. The surrounding routing area A2 surrounds at least a part of the hole area A1, and the regular routing area A3 surrounds at least a part of the surrounding routing area A2. The display panel 1 includes a substrate 10, a first wiring layer 11, a shield layer 12, a second wiring layer 13, a first wiring 111 and a second wiring 131. The first wiring layer 11 is formed on a side of the substrate 10. The shield layer 12 is formed on the side of the first wiring layer 11 facing away from the substrate 10. The second wiring layer 13 is formed on a side of the shield layer 12 facing away from the first wiring layer 11. The first wiring 111 includes a first straight segment 1111 positioned at the regular routing area A3 and a first curved segment 1112 positioned at the surrounding routing area A2. The first curved segment 1112 is positioned at the first wiring layer 11. The second wiring 131 includes a second straight segment 1311 positioned at the regular routing area A3 and a second curved segment 1312 positioned at the surrounding routing area A2. The second straight segment 1311 extends along the same direction as the first straight segment 1111. The second curved segment 1312 is positioned at the second wiring layer 13. An orthographic projection of the shield layer 12 on the substrate 10 overlaps an orthographic projection of the first curved segment 1112 on the substrate 10, and/or the orthographic projection of the shield layer 12 on the substrate 10 overlaps an orthographic projection of the second curved segment 1312 on the substrate 10.

In the display panel 1 provided in the present application, the hole area A1 can provide sufficient light for the photosensitive element so as to ensure the normal operation of the photosensitive element. No sub-pixel is provided in the hole area A1, and the wirings extending along the row and column directions need to bypass the hole area A1 in the hole area A1, so that parts of the wirings positioned in the vicinity of the hole area A1 extend along curves, avoiding the wirings passing through the hole area A1 and affecting the light transmittance of the hole area A1. Therefore, the surrounding routing area A2 is formed around the hole area A1, to accommodate the wirings extending along curves for avoiding the hole area A1. The regular routing area A3 is formed around the surrounding routing area A2. The rest of the wirings whose extension directions are not affected by the hole area A1, and parts of the wirings extending along straight lines are positioned at the regular routing area A3.

The above-mentioned wirings include but are not limited to data lines, scanning lines, reset signal lines, power supply signal lines, and the like, which are not specifically limited in the present application.

Figure 5:
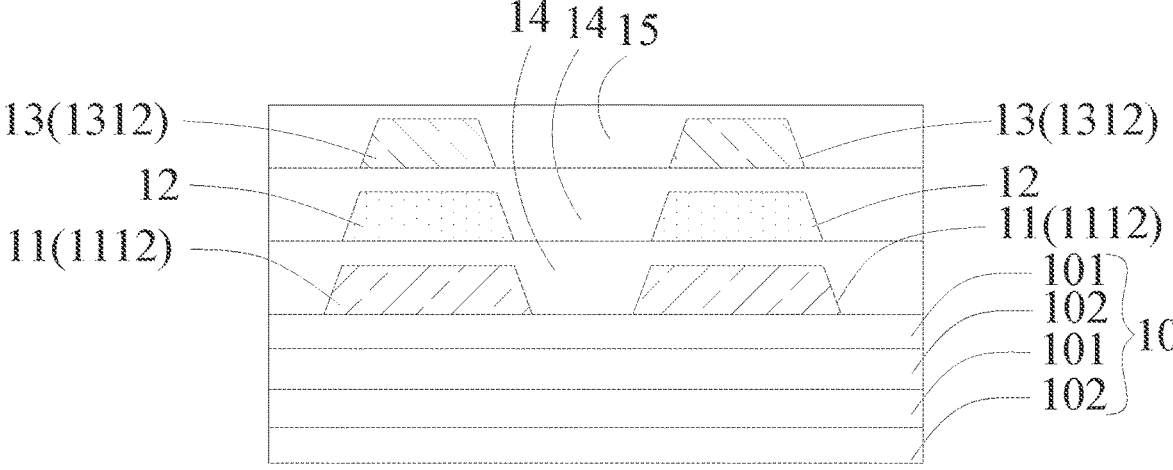
FIG. 5 is another sectional view taken along Q-Q' in FIG. 2.

The substrate 10 may be transparent, translucent, or opaque, which is not specifically limited in the present application. The substrate 10 may be a flexible substrate 10, of which the specific material may be polyimide. As shown in FIG. 5, the substrate 10 may be a composite substrate 10 including a flexible organic material layer 102 and an inorganic material barrier layer 101 that are stacked.

In the above embodiments, insulation layers 14 are provided between the first wiring layer 11 and the shield layer 12 and between the shield layer 12 and the second wiring layer 13 to facilitate insulation between adjacent layers. A planarization layer 15 or the like may also be formed on the side of the second wiring layer 13 facing away from the substrate 10, which is not specifically limited in this application.

The display panel 1 provided by the present application includes the substrate 10 and the first wiring layer 11, the shield layer 12 and the second wiring layer 13 formed on the substrate 10. The first wiring layer 11, the shield layer 12 and the second wiring layer 13 are stacked in sequence along a direction going away from the substrate 10. The first wiring 111 and the second wiring 131 are also included in the display panel 1. The first wiring 111 includes the first straight segment 1111 and the first curved segment 1112. The first curved segment 1112 is arranged around the hole area A1, is positioned at the surrounding routing area A2 and is positioned in the first wiring layer 11. The first straight segment 1111 is positioned at the regular routing area A3. The second wiring 131 includes the second straight segment 1311 and the second curved segment 1312. The second curved segment 1312 is arranged around the hole area A1, is positioned at the surrounding routing area A2 and is positioned in the second wiring layer 13. The second straight segment 1311 is positioned at the regular routing area A3 and extends along the same direction as the first straight segment 1111. The first straight segment 1111 and the first curved segment 1112 may be positioned in a same layer or different layers, and the second straight segment 1311 and the second curved segment 1312 may be positioned in a same layer or different layers, which is not specifically limited in the present application. The first wiring 111 and the second wiring 131 may be of a same type of signal line. Different wiring layers are used for the first curved segment 1112 in the first wiring 111 and the second curved segment 1312 in the second wiring 131, and the first curved segment 1112 and the second curved segment 1312 are stacked along a direction going away from the substrate 10. A double-wiring layer arrangement (that is, the first wiring layer 11 and the second wiring layer 13) is used for wiring, so that the wiring space is improved, and thus the distance between adjacent first curved segments 1112 or adjacent second curved segments 1312 can be reduced so as to reduce the width of the surrounding routing area A2.

In the display panel 1 provided by the present application, the shield layer 12 is arranged between the first wiring layer 11 and the second wiring layer 13. The orthographic projection of the shield layer 12 on the substrate 10 overlaps the orthographic projection of the first curved segment 1112 on the substrate 10, and/or the orthographic projection of the shield layer 12 on the substrate 10 overlaps the orthographic projection of the second curved segment 1312 on the substrate 10. Therefore, coupling capacitance between the first curved segment 1112 and the second curved segment 1312 can be effectively reduced, thereby reducing signal interference between the first curved segment 1112 and the second curved segment 1312, so as to improve the phenomenon of non-uniform display in the vicinity of the hole area A1 and improve the display quality.

In an embodiment, reference is made to FIG. 5, which is another sectional view along Q-Q' of FIG. 2. At least a part of the first curved segments 1112 are in one-to-one correspondence with at least a part of the second curved segments 1312, and for each pair of the first curved segments 1112 and the second curved segments 1312 that are in one-to-one correspondence, an orthographic projection of the second curved segment 1312 on the first wiring layer 11 is within the first curved segment 1112.

In the above embodiment, at least a part of the first curved segments 1112 are in one-to-one correspondence with at least a part of the second curved segments 1312, and the orthographic projection of the second curved segment 1312 on the first wiring layer 11 is within the first curved segment 1112, so that the space of the surrounding routing area A2 can be effectively used. At the same time, the first curved segments 1112 in the first wiring layer 11 and the second curved segments 1312 in the second wiring layer 13 are arranged in a one-to-one correspondence and directly opposite to each other along a direction perpendicular to the substrate 10, so that the first curved segment 1112 and the second curved segment 1312 occupy a relatively narrow surrounding routing area A2, facilitating the realization of a narrow design of the surrounding routing area A2.

Figure 6:
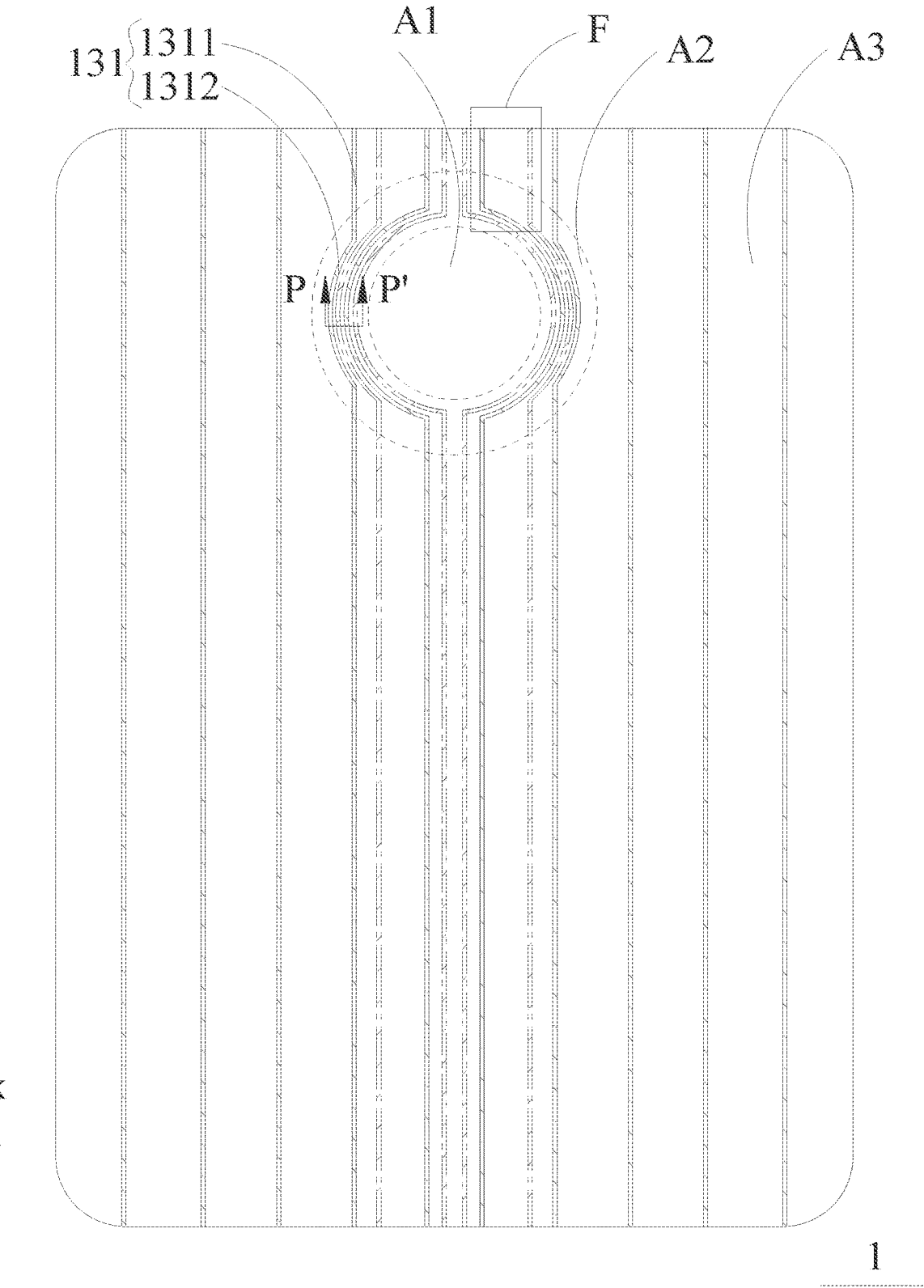
FIG. 6 is a top view of another display panel provided by an embodiment of the present application.
Figure 7:
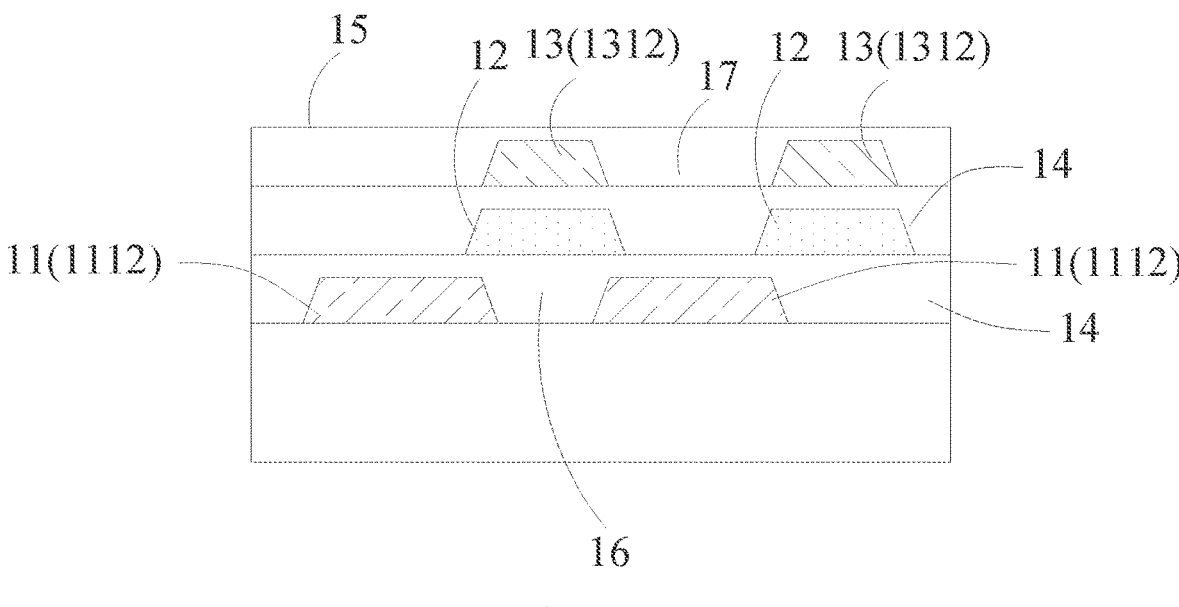
FIG. 7 is a sectional view taken along P-P' in FIG. 6.

In another embodiment, reference is made to FIG. 6 and FIG. 7. FIG. 6 is a top view of another display panel provided by an embodiment of the present application. FIG. 7 is a sectional view taken along P-P' in FIG. 6. A first spacing 16 exists between adjacent ones of the first curved segments 1112, and a second spacing 17 exists between adjacent ones of the second curved segments 1312. The second spacing 17 is covered by an orthographic projection of one of the first curved segments 1112 on the second wiring layer 13, and the first spacing 16 is covered by an orthographic projection of one of the second curved segments 1312 on the first wiring layer 11. That is, the first curved segments 1112 in the first wiring layer 11 are offset from the second curved segments 1312 in the second wiring layer 13, and this arrangement can increase the oblique distance between the first curved segment 1112 and the second curved segment 1312 to reduce mutual interference.

In an embodiment, the signals in different first curved segments 1112 are the same, the signals in different second curved segments 1312 are the same, and the signals in first curved segments 1112 are different from those in the second curved segments 1312.

In the above embodiment, the signals in different first curved segments 1112 are set to be the same, so that mutual interference between adjacent first curved segments 1112 can be reduced without adding a shield layer 12 between adjacent first curved segments 1112; the signals in different second curved segments 1312 are set to be the same, so that mutual interference between adjacent second curved segments 1312 can be reduced without adding a shield layer 12 between adjacent second curved segments 1312. Signals in the first curved segments 1112 are different from those in the second curved segments 1312, and at the same time, the shield layer 12 is provided between the first curved segments 1112 and the second curved segments 1312, which can reduce mutual interference between different signals in the first curved segments 1112 and the second curved segments 1312.

In an embodiment, the first wiring layer 11 may be provided as an entire layer inside the display panel 1, that is, being partially positioned at the surrounding routing area A2 and partially positioned at the regular routing area A3; the first wiring layer 11 may be provided only at the surrounding routing area A2, which is not specifically limited in this application. At the same time, the second wiring layer 13 may be provided as an entire layer inside the display panel 1, that is, being partially positioned at the surrounding routing area A2 and partially positioned at the regular routing area A3; the second wiring layer 13 may be provided only at the surrounding routing area A2, which is not specifically limited in this application.

Figure 8:
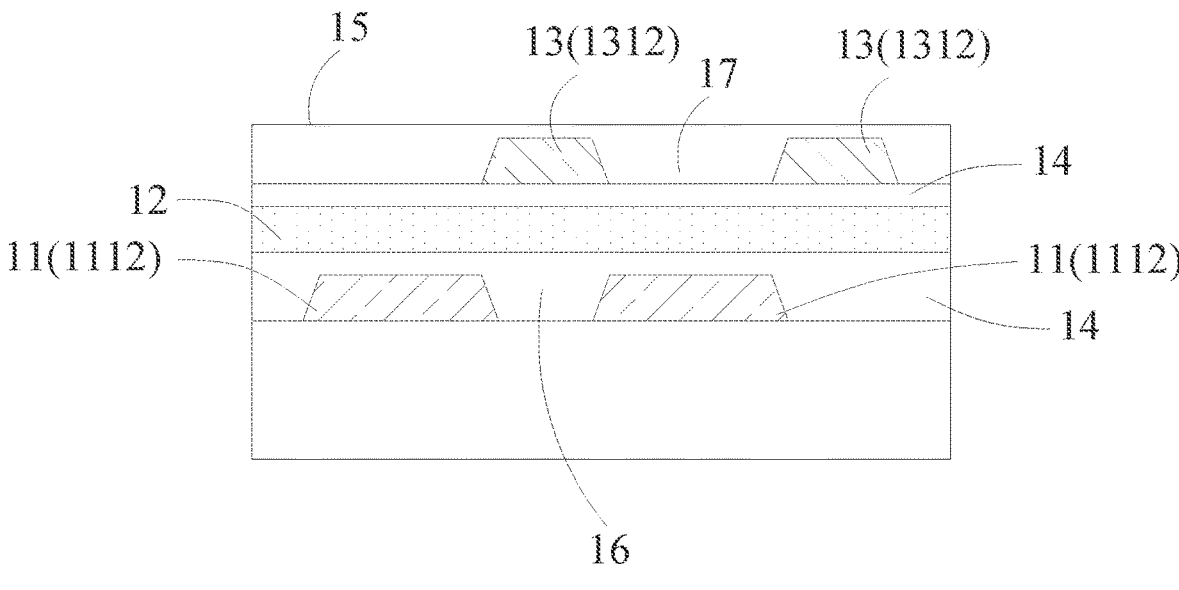
FIG. 8 is another sectional view taken along P-P' in FIG. 6.

In an embodiment, reference is made to FIG. 8, which is another sectional view taken along P-P' of FIG. 6. The shield layer 12 is positioned at the surrounding routing area A2, and the shield layer 12 is continuously provided as a whole layer.

In the above embodiment, the shield layer 12 is continuously provided as a whole layer in the surrounding routing area A2, so that the manufacturing process can be simplified and the oblique capacitive coupling between the first curved segment 1112 and the second curved segment 1312 can be reduced, further improving the signal shielding effect between the first curved segment 1112 and the second curved segment 1312.

In an embodiment, as shown in FIG. 7, the shield layer 12 is patterned so that the area of the shield layer 12 which is not covered by the second curved segment 1312 in the second wiring layer 13 forms a hollow portion, so that the problem that the part of the shield layer 12 which is not covered by the second curved segment 1312 is prone to light reflection when the display panel 1 is in a dark state can be alleviated, further improving the use experience of the display panel 1.

Figure 9:
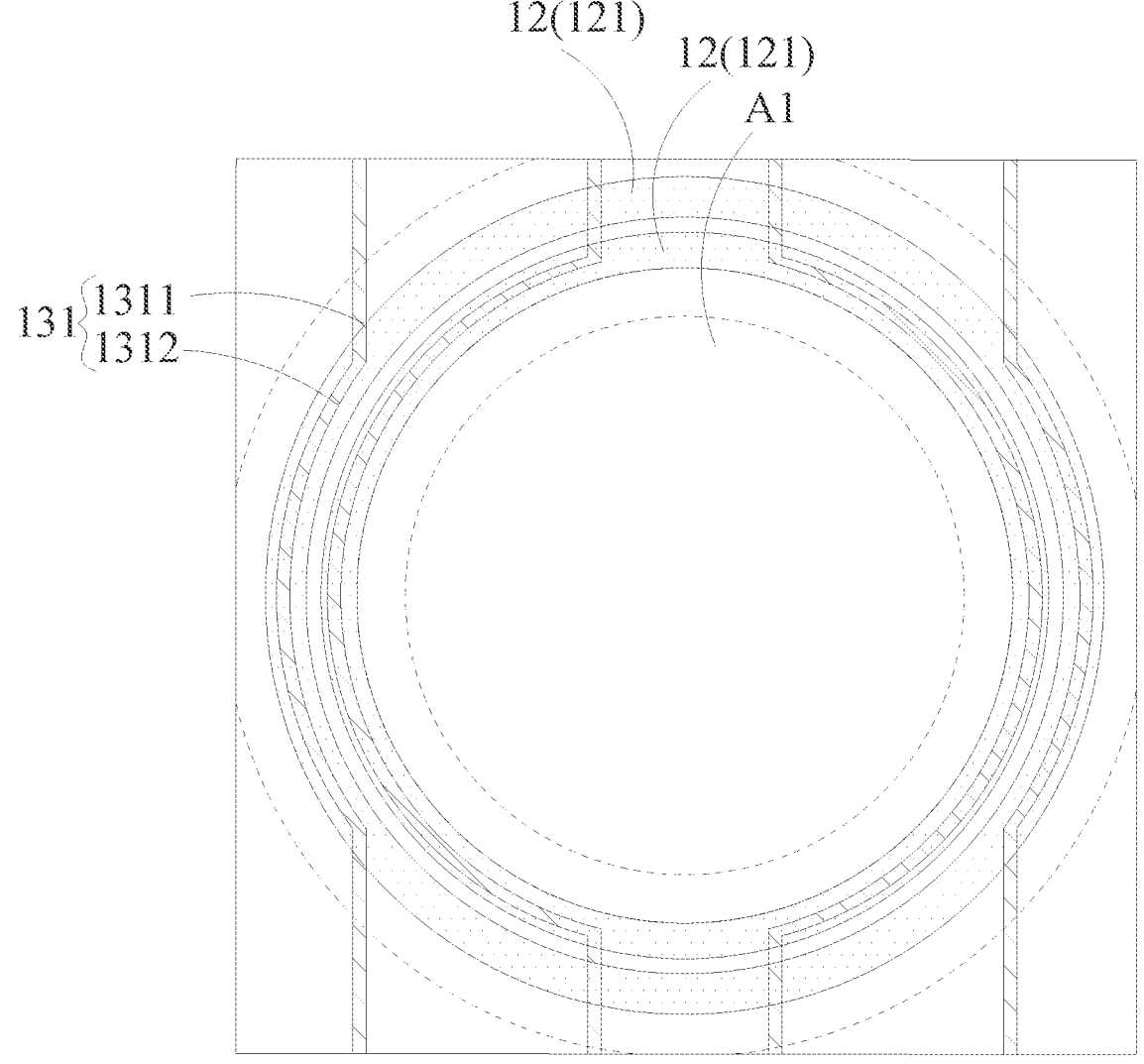
FIG. 9 is a magnified partial view of region E in FIG. 2.

In an embodiment, the patterned shield layer 12 includes a plurality of first shield units 121 arranged around the hole area A1 and nested inside one another in sequence. The first shield units 121 are structured as closed rings. An orthographic projection of each of the first shield units 121 on the first wiring layer 11 overlaps two of the first curved segments 1112 on both sides of the hole area A1. Alternatively, as shown in FIG. 9, which is a magnified partial view of the region E in FIG. 2, an orthographic projection of each of the first shield units 121 on the second wiring layer 13 overlaps two of the second curved segments 1312 on both sides of the hole area A1.

In the above embodiment, by patterning the shield layer 12, it can be ensured that the functional portion of the shield layer 12 is retained and the non-functional portion is removed. While the shielding effect on the first curved segment 1112 and the second curved segment 1312 is ensured, the reflection of light is reduced, and the problem of brightening around the hole area A1 due to the reflection of light by the shield layer 12 is alleviated. After the shield layer 12 is designed as the plurality of first shield units 121, the first shield units 121 may correspond to two first curved segments 1112 or two second curved segments 1312 along the circumferential direction of the hole area A1, and the first shield units 121 are annular, which are convenient to manufacture.

Figure 10:
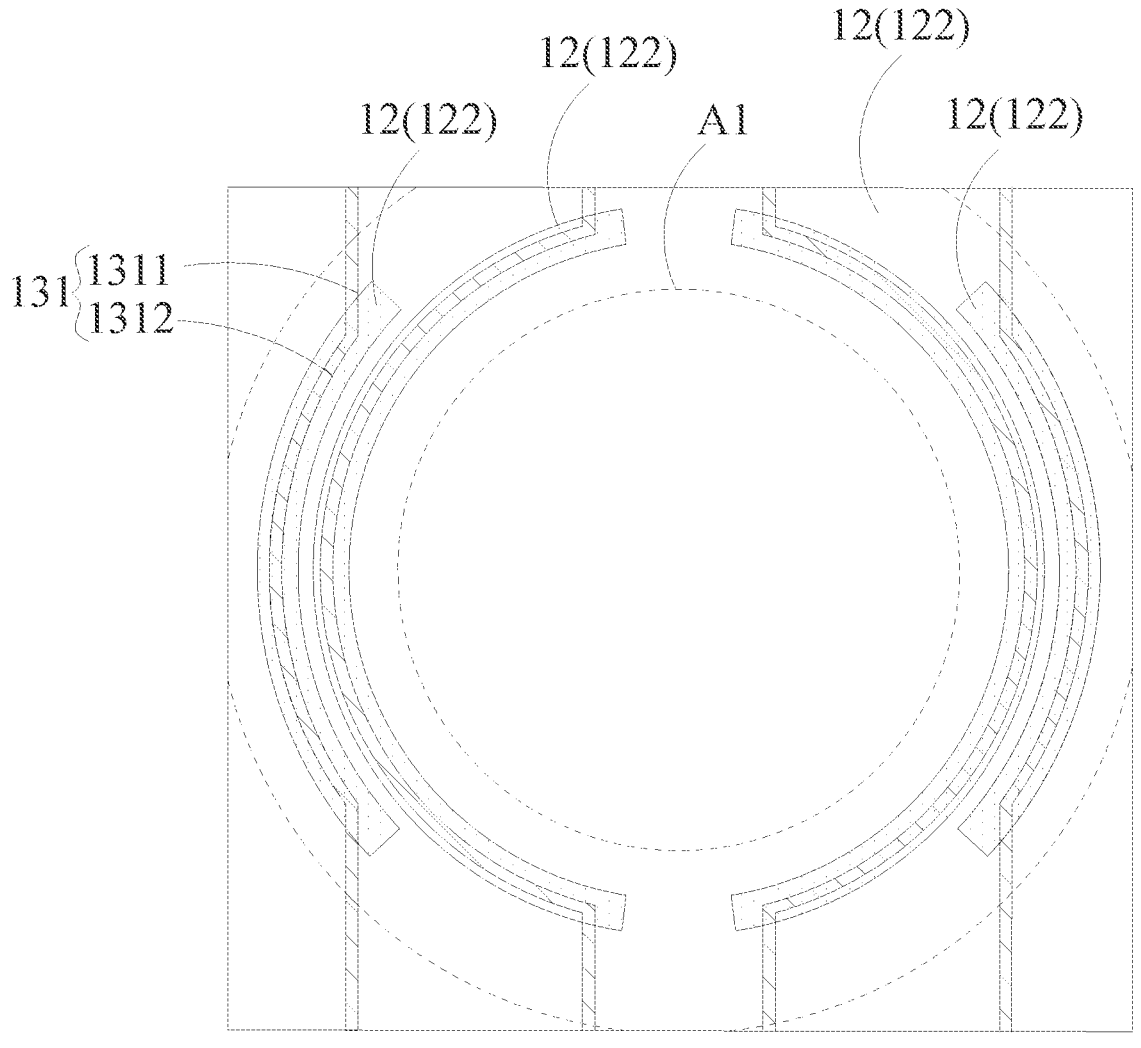
FIG. 10 is another magnified partial view of region E in FIG. 2.

In another embodiment, the patterned shield layer 12 includes a plurality of second shield units 122 arranged partially around the hole area A1 in sequence. An orthographic projection of the second shield unit 122 on the first wiring layer 11 overlaps one first curved segment 1112, or, as shown in FIG. 10, which is another magnified partial view of the region E in FIG. 2, the orthographic projection of each second shield unit 122 on the second wiring layer 13 overlaps one second curved segment 1312.

In the above embodiment, the shield layer 12 is designed as the plurality of second shield units 122. The second shield unit 122 corresponds to one first curved segment 1112 or one second curved segment 1312. That is, a proportion of the second shield unit 122 around the hole area A1 is less than half a circle, so that the area of the non-functional portion between adjacent second shield units 122 can be reduced along the direction around the hole area A1, thereby further reducing reflection of external light.

In an embodiment, the shield layer 12 is connected to a fixed potential end.

The fixed potential end in the present application refers to a potential end where the electric signal does not change (that is, the electric signal is fixed).

Connecting the shield layer 12 to the fixed potential end can effectively reduce the capacitive coupling between adjacent first curved segment 1112 and second curved segment 1312.

In an embodiment, the fixed potential end includes one of a supply voltage signal end and a reference voltage signal end.

There are multiple types of signal line in the display panel 1, and each type of signal line is connected to a set potential end. The signal lines in which the electrical signals do not change include a supply signal line, a reference voltage signal line and the like. The potential ends connected to the above-mentioned two types of signal line are a supply voltage signal end and a reference voltage signal end. Therefore, the supply voltage signal end and the reference voltage signal end can be reused as fixed potential ends electrically connected to the shield layer 12, so as to simplify the wiring in the display panel 1.

Figures 11, 12:
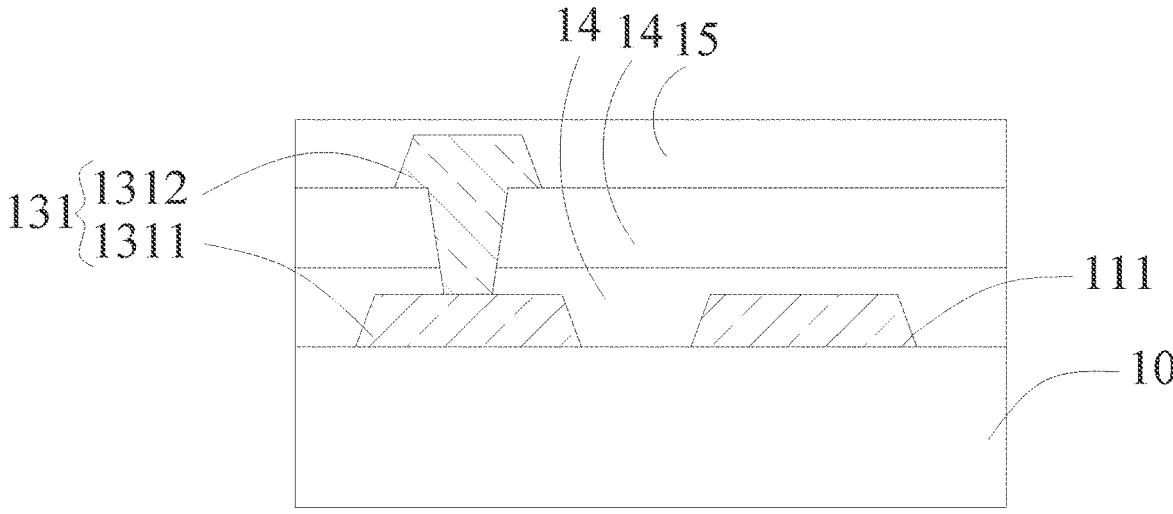
FIG. 11 is a magnified view of region F in FIG. 6.
FIG. 12 is a sectional view taken along M-M' in FIG. 11.
Figures 13, 14:
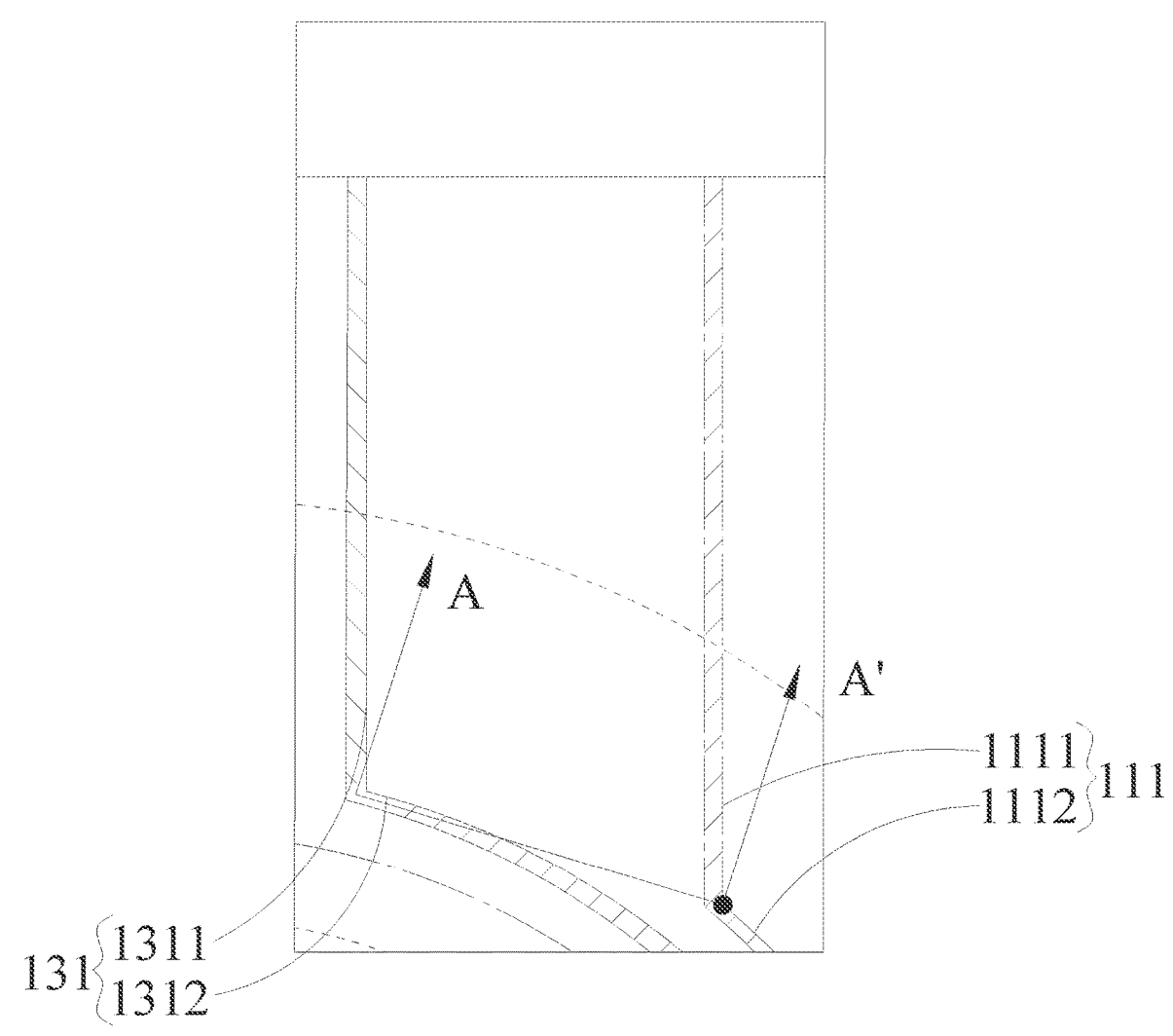
FIG. 13 is another magnified view of region F in FIG. 6.
FIG. 14 is a sectional view taken along A-A' in FIG. 13.

In an embodiment, the first straight segment 1111 and the second straight segment 1311 extend along a first direction x. The first straight segment 1111 and the second straight segment 1311 are arranged in the same layer. The first curved segment 1112 and the second curved segment 1312 are arranged in different layers. Reference is made to FIG. 11 and FIG. 12, FIG. 11 is a magnified view of the region F in FIG. 6, and FIG. 12 is a sectional view along M-M' in FIG. 11. The first straight segment 1111 is arranged in the same layer as the first curved segment 1112. Alternatively, reference is made to FIG. 13 and FIG. 14, FIG. 13 is another magnified view of the region F in FIG. 6, and FIG. 14 is a sectional view taken along A-A' in FIG. 13. The first straight segment 1111 is arranged in the same layer as the second curved segment 1312.

In the above embodiment, the first wiring 111 and the second wiring 131 together occupy two wiring layers including the first wiring layer 11 and the second wiring layer 13. Specifically, the first straight segment 1111 being arranged in the same layer as one of the first curved segment 1112 and the second curved segment 1312 including: the first straight segment 1111 and the first curved segment 1112 are arranged in the same layer, and the first straight segment 1111 and the first curved segment 1112 may be directly connected to each other (that is, the first straight segment 1111 and the first curved segment 1112 are of an integrated structure). In this case, the second straight segment 1311 and the second curved segment 1312 are arranged in different layers, and the second straight segment 1311 and the second curved segment 1312 are connected to each other through a via. Alternatively, the first straight segment 1111 being arranged in the same layer as one of the first curved segment 1112 and the second curved segment 1312 includes: the first straight segment 1111 and the second curved segment 1312 are arranged in the same layer, that is, the second straight segment 1311 and the second curved segment 1312 are arranged in the same layer and can be directly connected to each other (that is, the second straight segment 1311 and the second curved segment 1312 are of an integrated structure). In this case, the first straight segment 1111 and the first curved segment 1112 are arranged in different layers, and the first straight segment 1111 and the first curved segment 1112 are connected through a via.

Alternatively, the first straight segment 1111 is arranged in a different layer from the first curved segment 1112, and the first straight segment 1111 is arranged in different layer from the second curved segment 1312. In such embodiment, the first straight segment 1111 and the second straight segment 1311 are positioned in the same layer; the first straight segment 1111 is positioned in a different layer from the first curved segment 1112 and the second curved segment 1312; and the second straight segment 1311 is positioned in a different layer from the first curved segment 1112 and the second curved segment 1312. In such case, the first wiring 111 and the second wiring 131 together occupy three wiring layers. The first straight segment 1111 is arranged in a different layer from the first curved segment 1112 and connected to the first curved segment 1112 through a via, and the second straight segment 1311 is arranged in a different layer from the second curved segment 1312 and connected to the second curved segment 1312 through a via. The specific arrangement can be set according to the specific film layer structure of the display panel 1, which is not specifically limited in this application.

In the display panel 1 provided by the present application, the specific arrangement of the first wiring 111 and the second wiring 131 may include the manners described below.

Figure 15:
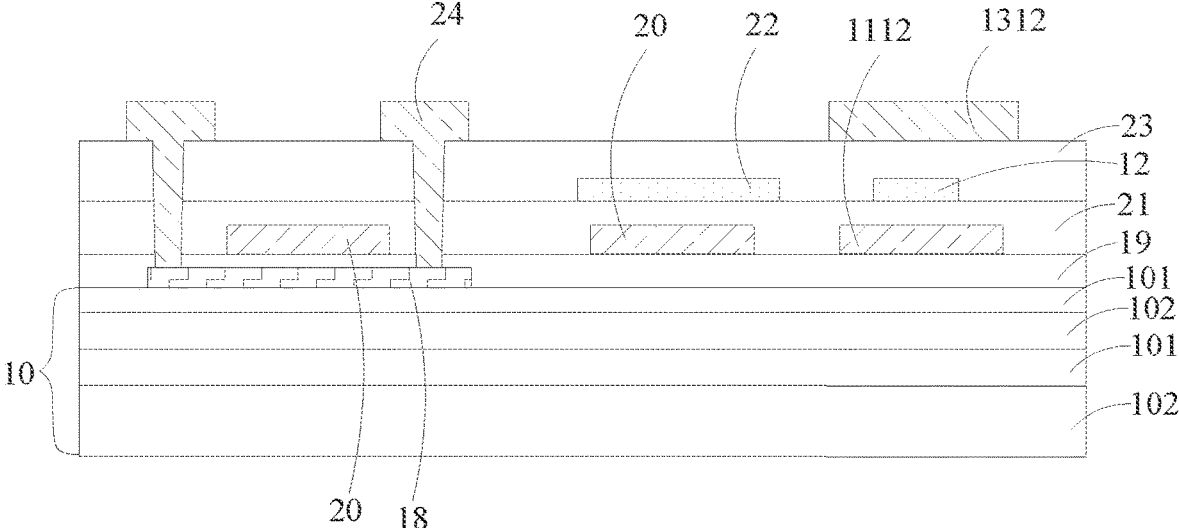
FIG. 15 is a schematic structural diagram of a film layer of a display panel provided by an embodiment of the present application.

In an embodiment, reference is made to FIG. 15, which is a schematic structural diagram of a film layer of a display panel provided by an embodiment of the present application. The display panel 1 includes a semiconductor layer 18, a first insulation layer 19, a gate metal layer 20, a second insulation layer 21, a capacitor metal layer 22, a third insulation layer 23 and a source/drain metal layer 24 that are stacked in sequence along a direction going away from a substrate 10.

The display panel 1 includes a driving circuit, and the driving circuit includes devices such as a transistor and a capacitor. The semiconductor layer 18 is used to form the source, drain and channel regions of the transistor. The gate metal layer 20 is used for forming the gate of the transistor and the lower electrode plate of the capacitor, and the material of the gate metal layer 20 may be selected as molybdenum. The first insulation layer 19 is used for implementing insulation between the semiconductor layer 18 and the gate metal layer 20, and the material of the first insulation layer 19 may be selected as silicon oxide. The capacitor metal layer 22 is used for forming an upper electrode plate of a capacitor, and the material of the capacitor metal layer 22 may be selected as molybdenum. The second insulation layer 21 is used for implementing insulation between the capacitor metal layer 22 and the gate metal layer 20, and the material of the second insulation layer 21 may be selected as silicon nitride. The source/drain metal layer 24 is used for forming a source/drain of a transistor, and the material of the source/drain metal layer 24 may be selected as molybdenum, or titanium, aluminium and titanium stacked in layers. The third insulation layer 23 is used for implementing insulation between the capacitor metal layer 22 and the source/drain metal layer 24, and the material of the third insulation layer 23 may be silicon oxide.

In the above embodiment, the first wiring layer 11 may be arranged in the same layer as the gate metal layer 20. The second wiring layer 13 may be arranged in the same layer as the source/drain metal layer 24. The first curved segment 1112 is positioned in the gate metal layer 20. The shield layer 12 is positioned in the capacitor metal layer 22. The second curved segment 1312 is positioned in the source/drain metal layer 24. The first straight segment 1111 is arranged in the same layer as the first curved segment 1112 or the second curved segment 1312. That is, the first straight segment 1111 is positioned in the gate metal layer 20 or the source/drain metal layer 24, and the second straight segment 1311 is positioned in the same layer as the first straight segment 1111.

In the above embodiment, the display panel 1 includes three metal layers (i.e., the gate metal layer 20, the capacitor metal layer 22 and the source/drain metal layer 24) that are stacked along a direction going away from the substrate 10. The first wiring layer 11 is arranged in the same layer as the gate metal layer 20; the shield layer 12 is arranged in the same layer as the capacitor metal layer 22; and the second wiring layer 13 is arranged in the same layer as the source/drain metal layer 24.

Figure 16:
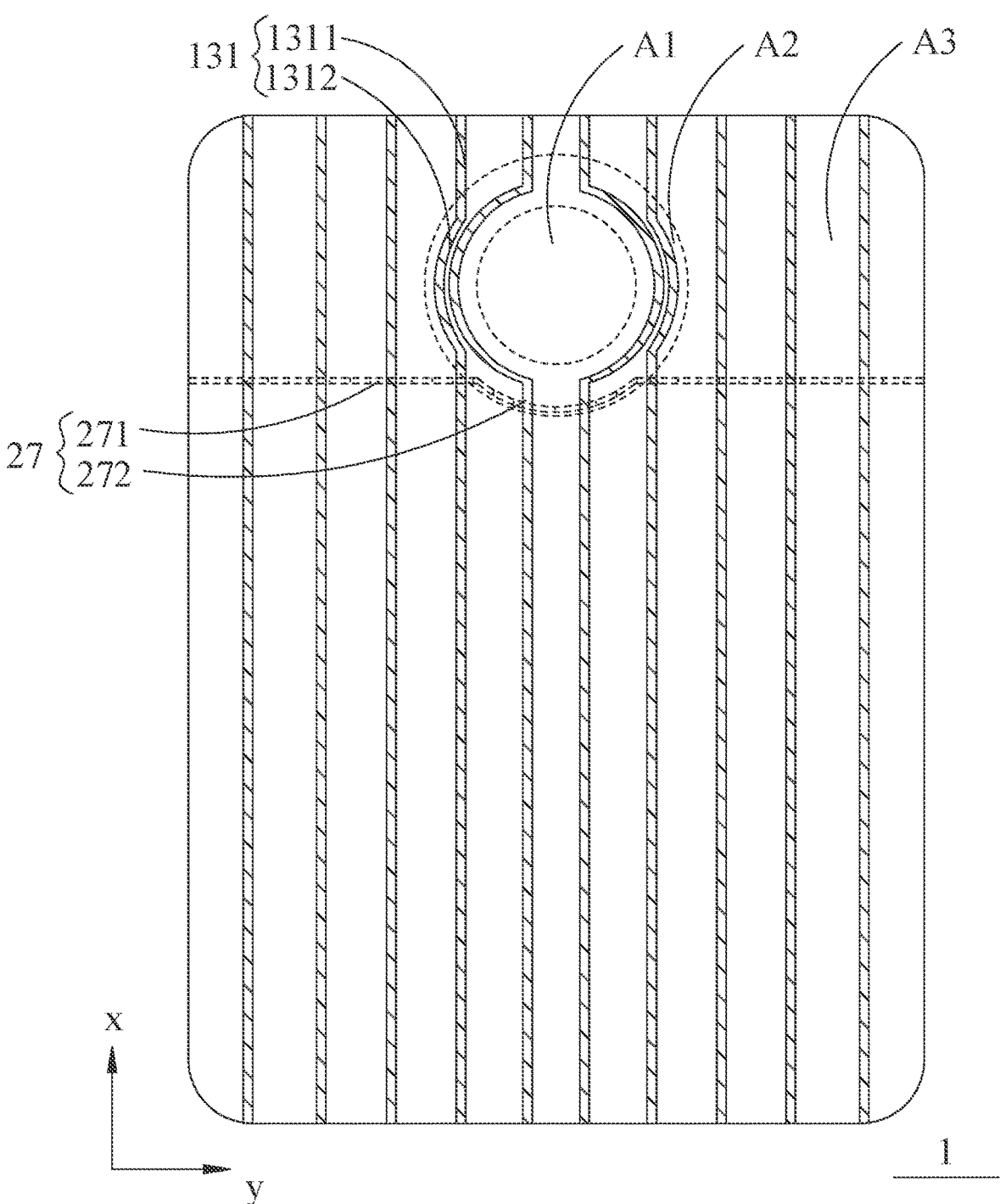
FIG. 16 is a top view of another display panel provided by an embodiment of the present application.

In the above embodiment, as shown in FIG. 16, the display panel 1 further includes a third wiring 27. The third wiring 27 includes a straight wire portion 271 positioned in the regular routing area A3 and a winding wire portion 272 positioned in the surrounding routing area A2. The straight wire portion 271 extends along a second direction y. The second direction y intersects the first direction x. The straight wire portion 271 and the winding wire portion 272 may be positioned in the same layer or in different layers, which is not specifically limited in this application. The third wiring 27 is arranged in a different layer from the first wiring 111, and the third wiring 27 is arranged in a different layer from the second wiring 131.

In the above embodiment, the third wiring 27 is arranged in a different layer from the second wiring 131 and the first wiring 111. In such case, a third wiring layer may be further provided for disposing the third wiring 27. The third wiring layer is arranged in a stacked manner with the gate metal layer 20, the capacitor metal layer 22 and the source/drain metal layer 24. Specifically, the third wiring layer may be positioned above or below any one of the gate metal layer 20, the capacitor metal layer 22 and the source/drain metal layer 24, which is not specifically limited in this application.

Figure 17:
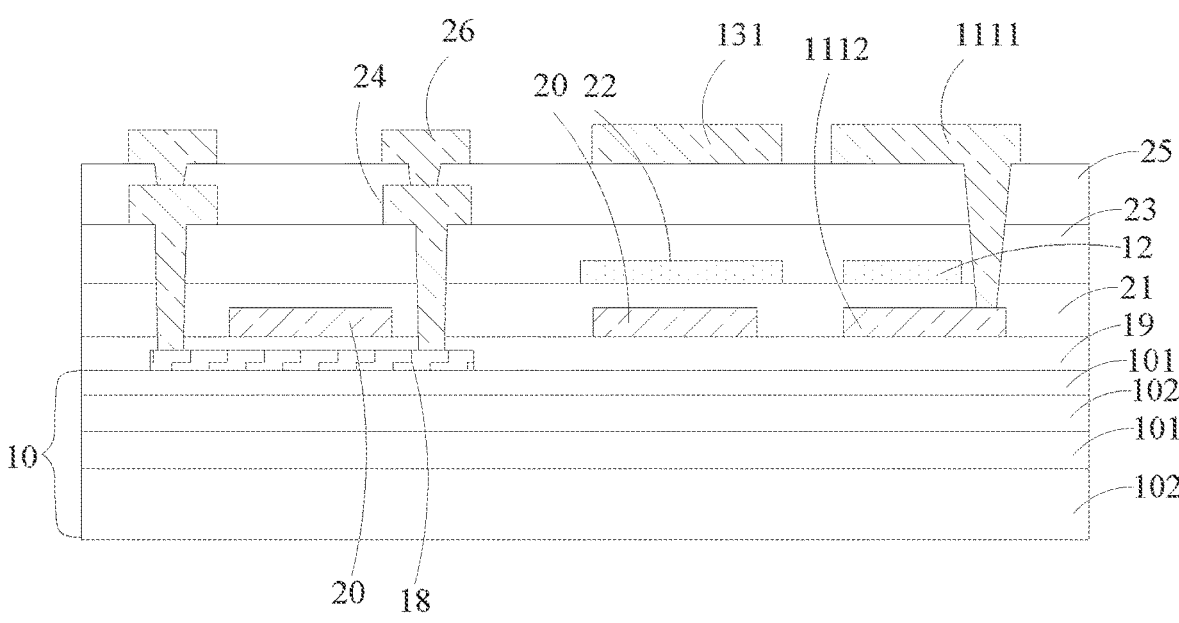
FIG. 17 is a schematic structural diagram of a film layer of another display panel provided by an embodiment of the present application.

In another embodiment, reference is made to FIG. 17, which is a schematic structural diagram of a film layer of another display panel provided by an embodiment of the present application. The display panel 1 further includes a semiconductor layer 18, a first insulation layer 19, a gate metal layer 20, a second insulation layer 21, a capacitor metal layer 22, a third insulation layer 23, a source/drain metal layer 24, a fourth insulation layer 25 and an auxiliary metal layer 26 that are stacked in sequence along a direction going away from the substrate 10. The second curved segment 1312, the first straight segment 1111 and the second straight segment 1311 are all positioned in the auxiliary metal layer 26. The second straight segment 1311 and the second curved segment 1312 are positioned in the same layer and are directly connected to each other, that is, the second wiring 131 in FIG. 17.

In the above embodiment, the material of the fourth insulation layer 25 may be selected as polyimide or the like, which is not specifically limited in this present application. The material of the auxiliary metal layer 26 may be selected as molybdenum, or titanium, aluminum and titanium stacked in layers.

In the above embodiment, the wiring space may be further increased by adding the auxiliary metal layer 26. When the wiring space is increased, the spacing between the wirings in the same layer can be increased, and the mutual interference between adjacent wirings can be reduced. At the same time, the increase of routing space can reduce the difficulty of routing and improve the production yield.

In the above embodiment, the display panel 1 includes four metal layers (that is, the gate metal layer 20, the capacitor metal layer 22, the source/drain metal layer 24 and the auxiliary metal layer 26) that are stacked along a direction going away from the substrate 10. The second wiring layer 13 may be arranged in the same layer as the auxiliary metal layer 26, that is, the second curved segment 1312 is positioned in the auxiliary metal layer 26, and the first straight segment 1111 and the second straight segment 1311 may be positioned in the same layer as the second curved segment 1312. In such case, the first curved segment 1112, the shield layer 12 and the third wiring 27 may respectively occupy one layer of the gate metal layer 20, the capacitor metal layer 22 and the source/drain metal layer 24, where the specific arrangement is not specifically limited in the present application.

Figure 18:
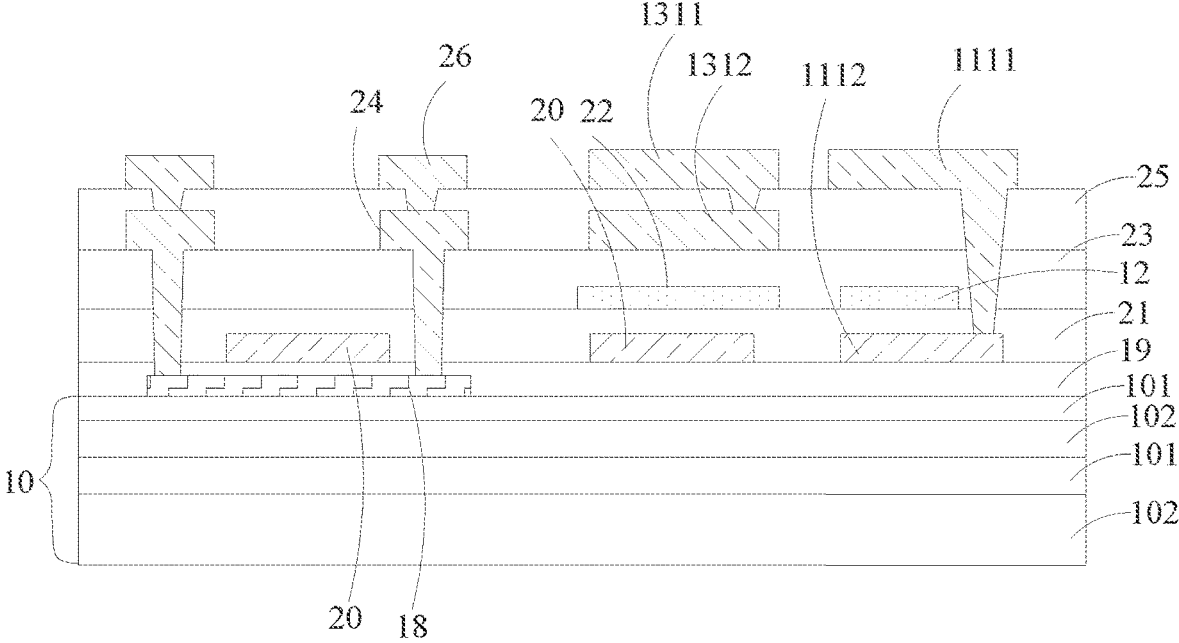
FIG. 18 is a schematic structural diagram of a film layer of another display panel provided by an embodiment of the present application.

In another embodiment, as shown in FIG. 18, the display panel 1 further includes a semiconductor layer 18, a first insulation layer 19, a gate metal layer 20, a second insulation layer 21, a capacitor metal layer 22, a third insulation layer 23, a source/drain metal layer 24, a fourth insulation layer 25 and an auxiliary metal layer 26 that are stacked in sequence along the direction going away from the substrate 10.

The first curved segment 1112 is positioned in the gate metal layer 20. The shield layer 12 is positioned in the capacitor metal layer 22. The second curved segment 1312 is positioned in the source/drain metal layer 24. The first straight segment 1111 and the second straight segment 1311 are both positioned in the auxiliary metal layer 26.

In the above embodiment, the first straight segment 1111 and the second straight segment 1311 are arranged in the same layer, and are arranged in a different layer from the first curved segment 1112 and the second curved segment 1312. The first straight segment 1111 is connected to the first curved segment 1112 through a via penetrating through the fourth insulation layer 25, the third insulation layer 23 and the second insulation layer 21. The second straight segment 1311 is connected to the second curved segment 1312 through a via penetrating through the fourth insulation layer 25.

In the above embodiment, the third wiring 27 is arranged in a different layer from the second wiring 131 and the first wiring 111. In such case, a third wiring layer may be further provided for disposing the third wiring 27. The third wiring layer is arranged in a stacked manner with the gate metal layer 20, the capacitor metal layer 22, the source/drain metal layer 24 and the auxiliary metal layer 26. Specifically, the third wiring layer may be positioned above or below any one of the gate metal layer 20, the capacitor metal layer 22, the source/drain metal layer 24 and the auxiliary metal layer 26, which is not specifically limited in this application.

In an embodiment, the first wiring 111 and the second wiring 131 are data lines, and the third wiring 27 is a scanning line; alternatively, the first wiring 111 and the second wiring 131 are scanning lines, and the third wiring 27 is a data line, which is not particularly limited in the present application.

In an embodiment, the shield layer 12 includes a layer of molybdenum material, a layer of silicon dioxide material and a layer of silicon material arranged in sequence along a direction going away from the substrate 10.

In the above embodiment, when the shield layer 12 is continuously provided as a whole layer in the surrounding routing area A2, a molybdenum material layer, a silicon dioxide material layer and a silicon material layer which are arranged in layers can be used. The molybdenum material layer has a relatively high electrical conductivity and is suitable as a main material of the shield layer 12. The silicon material layer may include monocrystalline silicon and amorphous silicon. The monocrystalline silicon is greyblack and the amorphous silicon is black, which has excellent absorption capacity for light. Therefore, arranging the silicon material layer on the side of the molybdenum metal layer away from the substrate 10 can reduce the reflection of ambient light in the area of the shield layer 12 which is not shielded by the second curved portion. Thus, the occurrence probability of the reflection phenomenon in dark state in the vicinity of the hole area A1 is reduced. Meanwhile, in order to prevent that the electron transport ability of the surface silicon material layer is poor and affects the shielding effect, a silicon oxide material layer may be provided as an insulation layer to prevent the silicon material layer from directly contacting the molybdenum metal layer to adversely affect the transport ability of the molybdenum metal layer.

In the above embodiment, with the arrangement of the material of the shield layer 12, the shield layer 12 can reduce reflection of light while ensuring a good shielding effect, and the dark state uniformity of the display panel 1 is improved.

Figure 19:
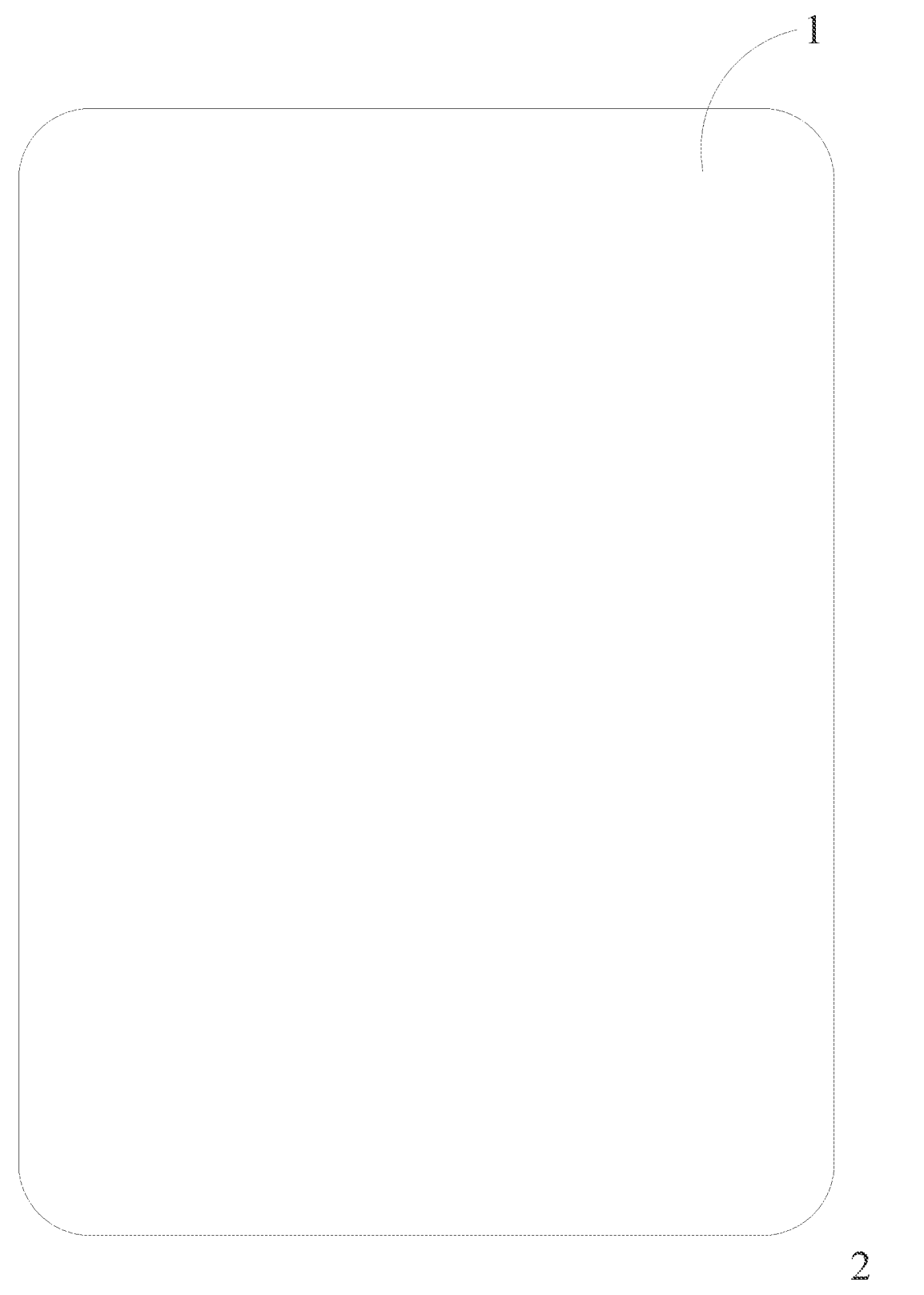
FIG. 19 is a top view of a display apparatus provided by an embodiment of the present application.

The present application further provides a display apparatus 2, as shown in FIG. 19, which is a top view of a display apparatus provided by an embodiment of the present application. The display apparatus 2 provided by this application includes any of the display panels 1 provided by the above embodiments of the present application.

The display apparatus 2 may be a mobile terminal such as a mobile phone or a tablet, or a fixed terminal such as a display or a television, and may also be a wearable device such as a watch, which is not specifically limited in this application. The signal interference in the vicinity of the hole area A1 of the display panel in the display apparatus 2 is greatly reduced, and the display effect is significantly improved, so that the user experience can be greatly improved.

According to the embodiments of present application described above, these embodiments do not describe all details thoroughly or do not limit the application to be the only specific embodiments. Obviously, many modifications and variations can be made according to the above description. These embodiments are selected and specifically described in this specification to better explain principles and practical application of the present application, so that a person skilled in the art is able to utilize well the present application and use the modifications based on the present application. The present application is limited only by claims and the full scope and equivalents of the claims.

What is claimed is:

1. A display panel, comprising a hole area, a surrounding routing area surrounding at least a part of the hole area, and a regular routing area surrounding at least a part of the surrounding routing area, wherein the display panel comprises:
   a substrate;
   a first wiring layer formed on a side of the substrate;
   a shield layer formed on a side of the first wiring layer facing away from the substrate;
   a second wiring layer formed on a side of the shield layer facing away from the first wiring layer;
   a first wiring including a first straight segment positioned at the regular routing area and a first curved segment positioned at the surrounding routing area, the first curved segment being positioned in the first wiring layer;
   a second wiring including a second straight segment positioned at the regular routing area and a second curved segment positioned at the surrounding routing area, the second straight segment extending along a same direction as the first straight segment, and the second curved segment being positioned in the second wiring layer;

wherein an orthographic projection of the shield layer on the substrate overlaps an orthographic projection of the first curved segment on the substrate, and/or the orthographic projection of the shield layer on the substrate overlaps an orthographic projection of the second curved segment on the substrate; and wherein the shield layer includes a molybdenum material layer, a silicon dioxide material layer and a silicon material layer arranged in sequence along a direction going away from the substrate.

2. The display panel according to claim 1, wherein the display panel comprises a plurality of the first curved segments and a plurality of the second curved segments; and at least a part of the first curved segments are in one-to-one correspondence with at least a part of the second curved segments, and for each pair of the first curved segment and the second curved segment that are in one-to-one correspondence, an orthographic projection of the second curved segment on the first wiring layer is within the first curved segment.

3. The display panel according to claim 1, wherein the display panel comprises a plurality of the first curved segments and a plurality of the second curved segments; and a first spacing exists between adjacent ones of the first curved segments, a second spacing exists between adjacent ones of the second curved segments, the second spacing is covered by an orthographic projection of one of the first curved segments on the second wiring layer, and the first spacing is covered by an orthographic projection of one of the second curved segments on the first wiring layer.

4. The display panel according to claim 1, wherein the display panel comprises a plurality of the first curved segments and a plurality of the second curved segments; and signals in different ones of the first curved segments are the same, signals in different ones of the second curved segments are the same, and the signals in the first curved segments are different from the signals in the second curved segments.

5. The display panel according to claim 1, wherein the shield layer is positioned at the surrounding routing area, and the shield layer is continuously provided as a whole layer.

6. The display panel according to claim 1, wherein the display panel comprises a plurality of the first curved segments and a plurality of the second curved segments;

the shield layer includes a plurality of first shield units arranged around the hole area and nested inside one another in sequence, and the first shield units are structured as closed rings; and an orthographic projection of each of the first shield units on the first wiring layer overlaps two of the first curved segments on both sides of the hole area, or an orthographic projection of each of the first shield units on the second wiring layer overlaps two of the second curved segments on both sides of the hole area.

7. The display panel according to claim 1, wherein the display panel comprises a plurality of the first curved segments and a plurality of the second curved segments, and the shield layer includes a plurality of second shield units arranged partially around the hole area in sequence; and an orthographic projection of each of the second shield units on the first wiring layer overlaps one of the first curved segments, or an orthographic projection of each of the second shield units on the second wiring layer overlaps one of the second curved segments.

8. The display panel according to claim 1, wherein the shield layer is connected to a fixed potential end.

9. The display panel according to claim 8, wherein the fixed potential end includes one of a supply voltage signal end and a reference voltage signal end.

10. The display panel according to claim 1, wherein the first straight segment and the second straight segment extend along a first direction, and the first straight segment and the second straight segment are arranged in a same layer;

wherein the first straight segment is arranged in a same layer as the first curved segment or the second curved segment, or, the first straight segment is arranged in a different layer from the first curved segment and the first straight segment is arranged in a different layer as the second curved segment.

11. The display panel according to claim 10, wherein the display panel comprises a semiconductor layer, a first insulation layer, a gate metal layer, a second insulation layer, a capacitor metal layer, a third insulation layer and a source/drain metal layer that are stacked in sequence along a direction going away from the substrate;

wherein the first curved segment is positioned in the gate metal layer, the shield layer is positioned in the capacitor metal layer, the second curved segment is positioned in the source/drain metal layer, and the first straight segment is positioned in the gate metal layer or the source/drain metal layer.

12. The display panel according to claim 10, wherein the display panel further comprises a semiconductor layer, a first insulation layer, a gate metal layer, a second insulation layer, a capacitor metal layer, a third insulation layer, a source/drain metal layer, a fourth insulation layer and an auxiliary metal layer that are stacked in sequence along a direction going away from the substrate;

wherein the second curved segment, the first straight segment and the second straight segment are all positioned in the auxiliary metal layer.

13. The display panel according to claim 10, wherein the display panel further comprises a semiconductor layer, a first insulation layer, a gate metal layer, a second insulation layer, a capacitor metal layer, a third insulation layer, a source/drain metal layer, a fourth insulation layer and an auxiliary metal layer that are stacked in sequence along a direction going away from the substrate;

wherein the first curved segment is positioned in the gate metal layer, the shield layer is positioned in the capacitor metal layer, the second curved segment is positioned in the source/drain metal layer, and the first straight segment and the second straight segment are both positioned in the auxiliary metal layer.

14. The display panel according to claim 10, wherein the display panel further comprises a third wiring, the third wiring includes a straight wire portion positioned at the regular routing area and a winding wire portion positioned at the surrounding routing area, the straight wire portion extends along a second direction intersecting the first direction;

wherein the third wiring is arranged in a different layer from the first wiring, and the third wiring is arranged in a different layer from the second wiring.

15. The display panel according to claim 14, wherein the first wiring and the second wiring are data lines, and the third wiring is a scanning line; or the first wiring and the second wiring are scanning lines, and the third wiring is a data line.

16. A display apparatus comprising a display panel, the display panel comprising a hole area, a surrounding routing area surrounding at least a part of the hole area, and a regular routing area surrounding at least a part of the surrounding routing area, wherein the display panel comprises:

a substrate;

a first wiring layer formed on a side of the substrate;

a shield layer formed on a side of the first wiring layer facing away from the substrate;

a second wiring layer formed on a side of the shield layer facing away from the first wiring layer;

a first wiring including a first straight segment positioned at the regular routing area and a first curved segment positioned at the surrounding routing area, the first curved segment being positioned in the first wiring layer;

a second wiring including a second straight segment positioned at the regular routing area and a second curved segment positioned at the surrounding routing area, the second straight segment extending along a same direction as the first straight segment, and the second curved segment being positioned in the second wiring layer;

wherein an orthographic projection of the shield layer on the substrate overlaps an orthographic projection of the first curved segment on the substrate, and/or the orthographic projection of the shield layer on the substrate overlaps an orthographic projection of the second curved segment on the substrate; and wherein the shield layer includes a molybdenum material layer, a silicon dioxide material layer and a silicon material layer arranged in sequence along a direction going away from the substrate.

* * * * *